(12) United States Patent
Shen et al.

(10) Patent No.: US 11,493,288 B2
(45) Date of Patent: Nov. 8, 2022

(54) NANOWIRE-BASED THERMAL INTERFACE

(71) Applicant: CARNEGIE MELLON UNIVERSITY, Pittsburgh, PA (US)

(72) Inventors: Sheng Shen, Pittsburgh, PA (US); Wei Gong, Pittsburgh, PA (US); Pengfei Li, Pittsburgh, PA (US); Lin Jing, Pittsburgh, PA (US)

(73) Assignee: CARNEGIE MELLON UNIVERSITY, Pittsburgh, PA (US)

( * ) Notice: Subject to any disclaimer, the term of this patent is extended or adjusted under 35 U.S.C. 154(b) by 173 days.

(21) Appl. No.: 17/106,608

(22) Filed: Nov. 30, 2020

(65) Prior Publication Data
US 2021/0080200 A1 Mar. 18, 2021

Related U.S. Application Data

(63) Continuation-in-part of application No. 16/436,167, filed on Jun. 10, 2019, now Pat. No. 10,971,423.

(60) Provisional application No. 62/763,297, filed on Jun. 8, 2018.

(51) Int. Cl.
F28F 13/18 (2006.01)
B82Y 40/00 (2011.01)
B82Y 30/00 (2011.01)

(52) U.S. Cl.
CPC ............... *F28F 13/18* (2013.01); *B82Y 30/00* (2013.01); *B82Y 40/00* (2013.01)

(58) Field of Classification Search
CPC ........ C09K 5/14; F28F 2255/20; F28F 13/18; H01L 23/3677; H01L 23/3733; H01L 23/3736; H01L 23/42; B82Y 30/00; B82Y 40/00; B82Y 10/00
USPC ........................................................ 252/71
See application file for complete search history.

(56) References Cited

U.S. PATENT DOCUMENTS

| 9,601,452 | B2 | 3/2017 | Starkovich et al. |
| 9,711,407 | B2* | 7/2017 | Or-Bach ............ H01L 27/11578 |
| 10,971,423 | B2* | 4/2021 | Shen .................. H01L 23/42 |
| 2013/0299217 | A1* | 11/2013 | Yuen .................... H05K 1/097 |
| | | | 977/932 |
| 2016/0251769 | A1 | 9/2016 | Silverman et al. |
| 2017/0040296 | A1 | 2/2017 | Das et al. |
| 2017/0146302 | A1 | 5/2017 | Starkovich et al. |
| 2018/0155824 | A1 | 6/2018 | Berg et al. |

OTHER PUBLICATIONS

Barako et al., "Thermal Conduction in Vertically Aligned Copper Nanowire Arrays and Composites", ASC Applied Materials & Interfaces, 7 (34), pp. 19251-19259, 2015.
Barako et al., "Dense Vertically Aligned Copper Nanowire Composites as High Performance Thermal Interface Materials", ASC Applied Materials & Interfaces, 9 (48), pp. 42067-42074, 2017.

* cited by examiner

*Primary Examiner* — Douglas J McGinty
(74) *Attorney, Agent, or Firm* — KDB Firm PLLC

(57) ABSTRACT

A high-performance thermal interface comprising a nanowire array disposed between a bottom metal layer and a top metal layer in which each nanowire is coated with a 3D fuzzy graphene layer. The thermal interface can be used by bonding it to the surfaces of adjoining substrates using layers of solder.

17 Claims, 17 Drawing Sheets

802

810

810

806

NANOWIRE-BASED THERMAL INTERFACE

RELATED APPLICATIONS

This application is a continuation-in-part of, and claims the benefit of and priority to, U.S. patent application Ser. No. 16/436,167 filed Jun. 10, 2019, which claims priority to U.S. Provisional Patent Application No. 62/763,297, filed Jun. 8, 2018. The contents of both previous applications are incorporated herein in their entirety.

GOVERNMENT RIGHTS

This invention was made with U. S. Government support under contract D14AP00008, awarded by the Department of the Interior. The U. S. Government has certain rights in this invention.

BACKGROUND OF THE INVENTION

Continually increasing power dissipation has become a dominant limiting factor for the performance of modern electronics, such as computer chips, solid state lasers, high-power electronics, and LED modules. Consequently, highly effective, compact, and reliable heat removal solutions are generally required for various electronics, particularly in pursuit of concurrent size reduction and operating speed increase. Such thermal challenges are negatively impacting numerous areas from microelectronics, portable electronics and wearable devices to massive data centers. For instance, as the power density dissipated by logic chips reaches 100 W/cm$^2$, the scaling of microelectronics, such as complementary metal-oxide-semiconductor (CMOS) transistors has entered a phase of "power-constrained scaling" in which power density cannot increase further without substantially improved cooling technologies.

On the other hand, due to the dramatic increase in power density, the thermal resistance of interfaces has been widely identified as a bottleneck in the thermal management of electronics, where it can constitute more than 50% of the total thermal resistance from device to cooling fluid. Thermal interface materials (TIMs) are commonly employed to reduce thermal contact resistance by filling up interfacial gaps and dissipating heat, thus increasing device life-time and reliability. High-performance TIMs must simultaneously possess high thermal conductivity for significantly reducing thermal resistance, and high mechanical compliance for resolving mismatch in coefficients of thermal expansion between two jointed materials that can cause delamination and device failure Existing TIMs such as solders, greases, gels, and epoxies cannot provide the required thermal and mechanical multi-functionality. Solder TIMs usually have high thermal conductivity but very poor mechanical compliance, due to their stiff nature. Polymer-based TIMs offer high compliance but low thermal conductivity, on the order of 1 W/m·K. Large-scale nanostructures including nanowires, nanotubes, nanofibers, and their composites, have emerged as promising materials for TIM applications. Among them, vertically-aligned carbon nanotube (CNT) arrays have generated significant interest because of the high mechanical compliance and the high intrinsic thermal conductivity of CNTs. Nevertheless, the relatively large thermal contact resistance when using CNTs severely limits their potential as TIMs because most CNTs do not have the same height due to non-uniform growth, and their ends are highly entangled.

While the copper nanowires grown from polycarbonate membranes have been measured to have a thermal conductivity as high as 70 W/m·K, their mechanical compliance and reliability under thermal cycling still remain unknown because of the crosslinks between the nanowires. A compliant polymer TIM was developed using arrays of polythiophene nanofibers in which individual nanofibers have a moderate thermal conductivity up to 4.4 W/m·K.

SUMMARY OF THE INVENTION

Disclosed herein is a high-performance thermal interface comprising a nanowire array disposed between two metal plates wherein each nanowire in the nanowire array is coated with a 3D fuzzy graphene layer. The thermal interface is ultra-compliant, exhibiting a Young's modulus 2-3 orders of magnitude lower, and a shear modulus 3-4 orders of magnitude lower than traditional solders, and which is capable of reducing the thermal resistance by two times as compared with the state-of-the-art TIMs.

The thermal interface also exhibits exceptional long-term reliability with >1,280 thermal cycles (corresponding to >640 hours) over a wide temperature range. By resolving the critical thermal bottleneck, the thermal interface enables electronic systems, ranging from microelectronics to portable electronics to massive data centers, to operate at lower temperatures, or at the same temperature but with higher performance and higher power density.

DETAILED DESCRIPTION

The thermal interface layer of the present invention comprises heterogeneous nanowires composed of segmented portions of copper and tin. The tin segment of each nanowire maintains excellent solderability and thermal contact with other surfaces, whereas the compliant and thermally conductive copper segment of the nanowire efficiently transfers heat and accommodates thermal stresses generated at interfaces.

In preferred embodiments, each nanowire is composed of a copper segment and a tin segment, with the copper segment comprising 60% to 80% of the overall height of the nanowire, with the remaining height of the nanowires comprising the tin segment. In preferred embodiments, the overall length of the nanowires is between about 10 μm and 100 μm. Note that the larger lengths of nanowires result in a more mechanically compliant HPTIM, while shorter lengths result in a less mechanically compliant HPTIM. To minimize thermal resistance, the nanowire height needs to be as small as possible, however, with shorter nanowires, the material becomes stiffer.

In preferred embodiments, the filling ratio of the nanowires will be between 15% to 75% of the overall surface area of the substrates being bonded, with an optimal density of about 50%. There is a trade-off between thermal conductivity and mechanical compliance as a function of density. Less dense HPTIMs will be more mechanically compliant but less thermally conductive, while denser HPTIMs will be less mechanically compliant but more thermally conductive. Additionally, the aspect ratio of the nanowires (i.e., the ratio of the height to the diameter) should be in the range of 100-1000. A higher aspect ratio corresponds to a higher mechanical compliance.

In preferred embodiments, the measured elastic and shear moduli of copper nanowires are in the ranges of 200 MPa to 1.5 GPa, and 2 MPa to 15 MPa, respectively, which are 2-3 orders of magnitude smaller than the bulk values of copper. The HPTIM also exhibits an extremely low thermal resistance of ~0.5 mm²·KW in a fully bonded configuration, which is about 2 times smaller than the state-of-the-art TIMs. More importantly, thermal cycling tests over a wide temperature range show that the HPTIM can stably work for >1,280 cycles, thus unambiguously demonstrating its long-term reliability.

Figures 2A, 2B:
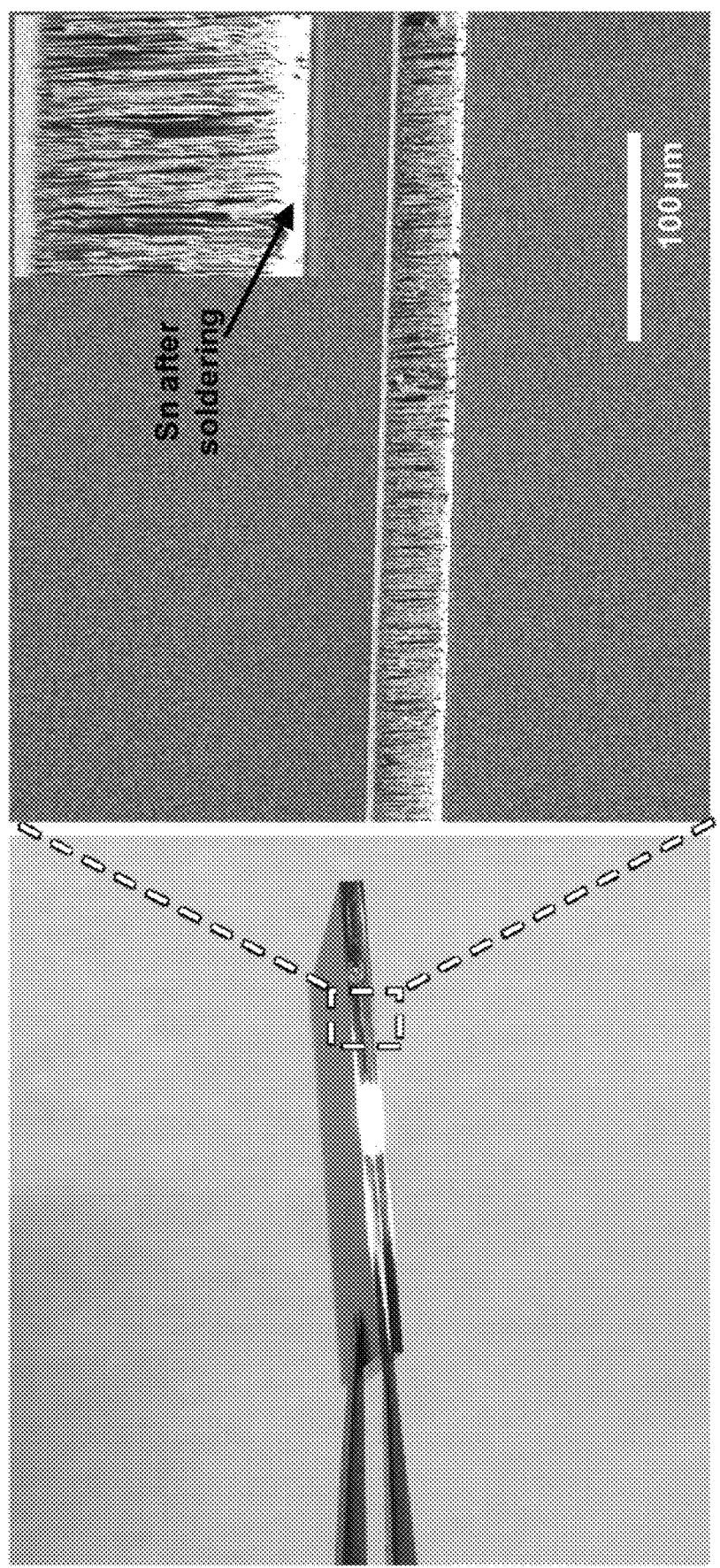
FIG. 2(A) is a photo of two silicon substrates bonded by the HPTIM, with a SEM image of a portion of the photograph shown in FIG. 2(B), showing a cross section of the bonded assembly. The inset shows a zoomed-in image of the continuous tin layer formed by tin nanowires after soldering.

The polymer-like compliance of the HPTIM originates from the high aspect ratio of the nanowires. In FIG. 2, vertically aligned heterogeneous copper-tin nanowires can be grown on a broad range of substrates, such as metals, dielectrics and semiconductors. Similar to conventional solders, the copper-tin nanowire arrays can be used to bond a variety of materials, as in the example shown in FIG. 2 showing the bonding of two silicon substrates. The height of the tin nanowire segment is typically 5-10 μm. By applying a well-controlled compression force when soldering, tin nanowire segments turn to micron-sized tin particles and merge into a continuous layer bonded with the copper nanowire segments, as shown in the inset of FIG. 2(B).

Figure 3:
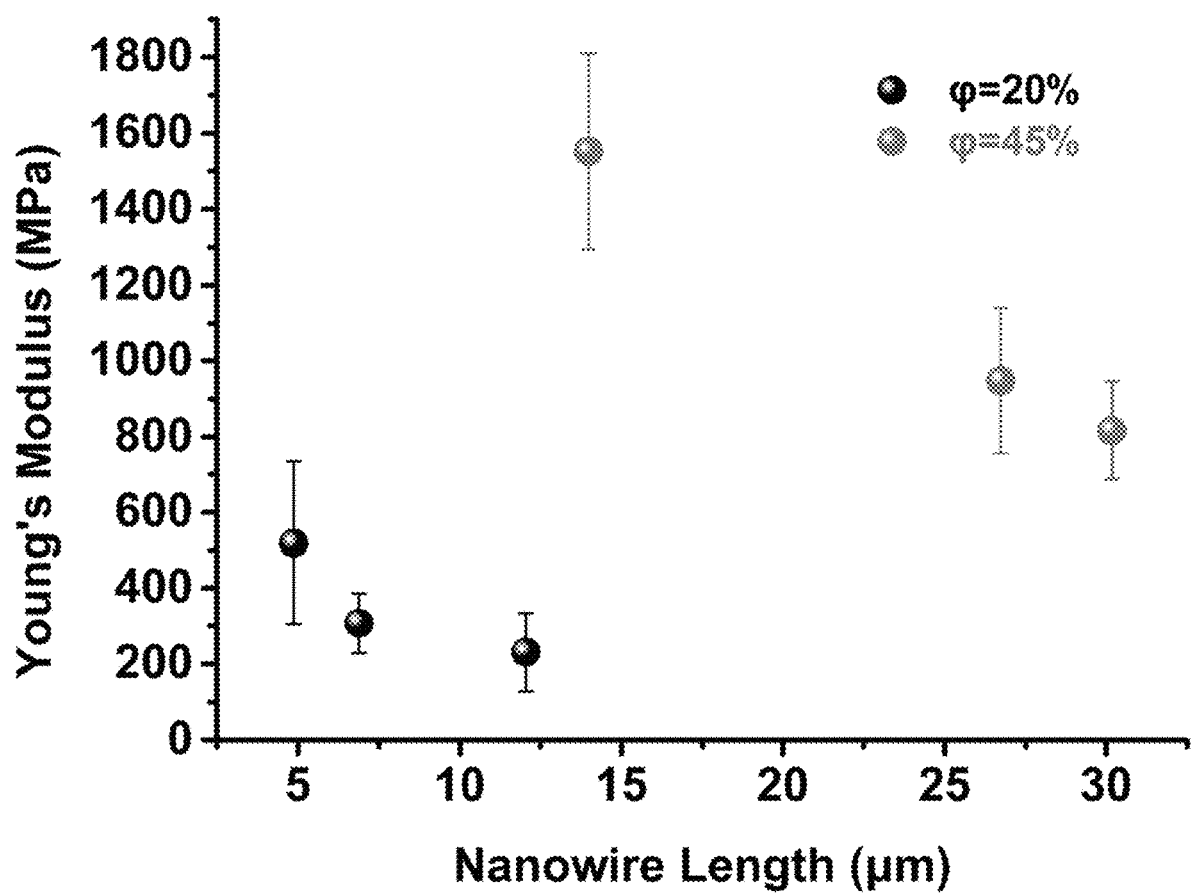
FIG. 3 is a graph showing the Young's modulus of the HPTIM as a function of nanowire length and filling ratio.

In one embodiment, the copper segments of the nanowires, which are suspended between the two substrates after soldering, as shown in FIG. 2(B), undergo both compressive and shear stresses induced by temperature fluctuations. The elastic and shear moduli of copper nanowires can be characterized with two filling ratios φ of ~20% and ~45%. The Young's moduli of the samples are measured by quasi-static partial unload tests with a square-shaped punch probe, where, during each measurement, 20 cycles of load/unload tests are applied, or, alternatively, load/unload cycles are applied until buckling of nanowires occurs. The Young's modulus of the copper nanowire arrays is calculated from the well-known Oliver-Pharr model based on the measured force-displacement curves. The Young's modulus increases with the normal force in the early stage of the tests because of the non-parallelism between the probe and the sample surfaces, which results in fewer nanowires in contact with the probe at the beginning. For larger normal forces when the indentation goes deeper, the Young's modulus reaches a plateau, which represents the overall response from the nanowire arrays and therefore the ultimate Young's modulus of the sample. In FIG. 3, for the samples with φ=20%, the measured Young's modulus is within a range of 200-500 MPa, whereas for φ=45%, the range of Young's modulus is from 750 MPa to 1.5 GPa. The results show that the measured Young's moduli are 2 to 3 orders of magnitude smaller than that of bulk copper.

The shear moduli of the samples are measured by two-dimensional scratch tests using the same probe. By measuring the lateral force F as a function of the corresponding lateral displacement Δx, the shear modulus of the samples can be calculated by the equation:

$$G = \frac{Fl}{A\Delta x'} \tag{1}$$

where:
l is the length of the copper nanowires; and
A is the shearing area.

Figure 4:
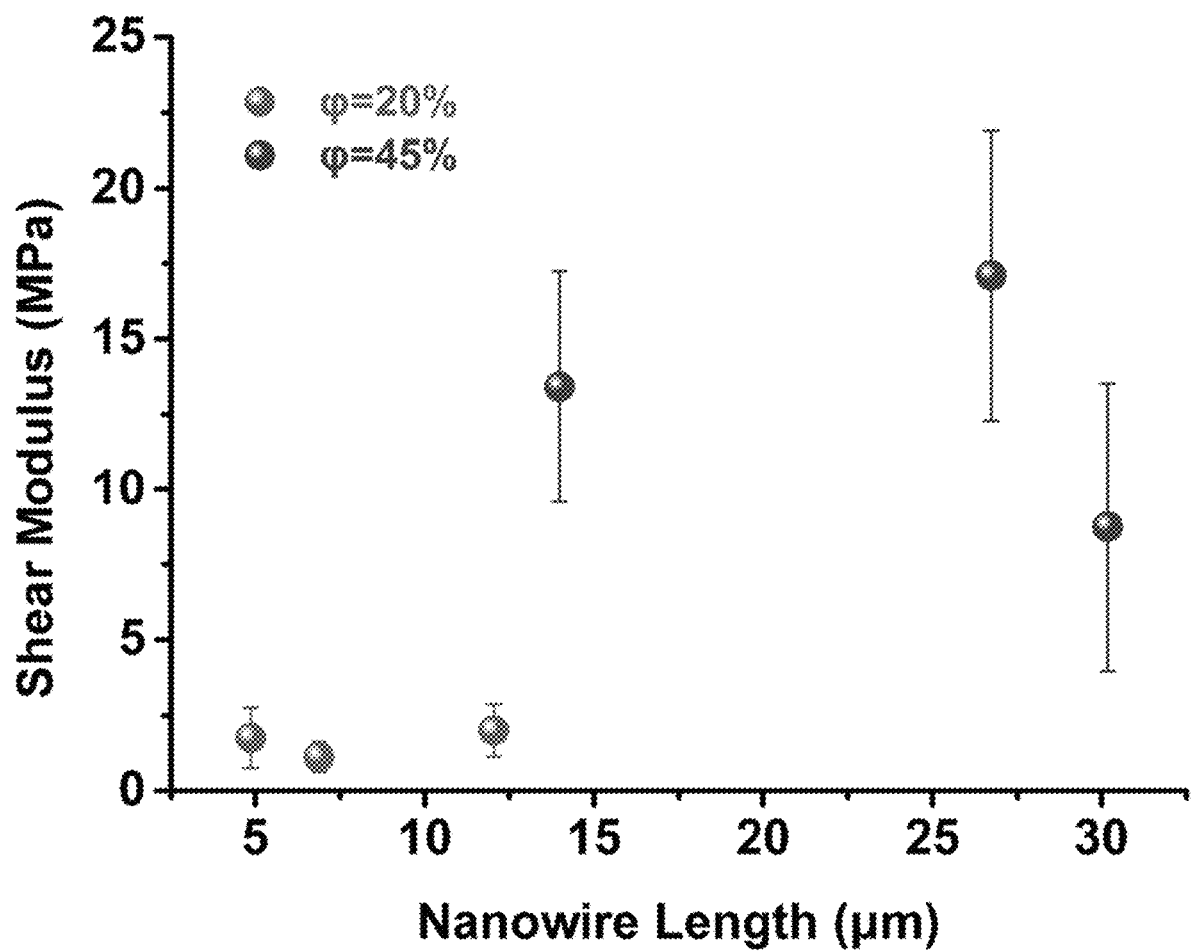
FIG. 4 is a graph of the shear modulus of the HPTIM as a function of nanowire length and filling ratio.

For all the samples, the measured lateral displacement of the nanowires is approximately linear with the applied lateral force. In FIG. 4, the measured shear modulus ranges from 8 MPa to 17 MPa for the samples with φ=45%. The shear modulus for the samples with φ=20% is extremely small, ranging from 1 MPa to 3 MPa, which is 4 orders of magnitude smaller than that of bulk copper. Experimental results demonstrate the high compliance of vertically aligned copper nanowire arrays. With a lower filling ratio (φ=20% versus φ=45%), the nanowires are more mechanically compliant. However, if the nanowires are too dense (e.g., φ>50%), their mechanical compliance is found to be dramatically reduced due to the mechanical interaction between nanowires. The measured Young's moduli generally decrease with the increase of nanowire heights, as shown in FIG. 3, due to the reduced aspect ratio of nanowires, but there is no obvious height dependence on shear modulus, as observed in FIG. 4, because the height influence on the measured shear moduli is offset when using equation (1) above.

Figure 5A:
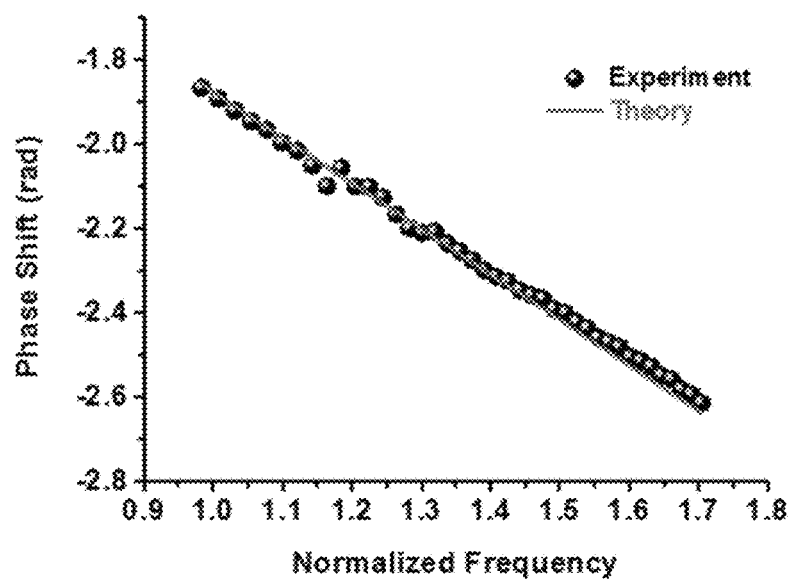
FIGS. 5(A)-5(B) are graphs showing the phase shift versus normalized frequency in a thermal cycling test and the temperature history of the top and the bottom surfaces of a bonded TIM assembly during the first 8 cycles of the test, in which one cycle takes 30 minutes divided equally for both the heating and the cooling periods, respectively.

A number of thermal properties, such as thermal conductivity, and the thermal resistance and contact resistance in a bonded configuration, are crucial for TIMs to minimize the overall thermal resistance across interfaces. The thermal conductivity of copper nanowires and the overall thermal resistance of the HPTIM in a fully bonded configuration can both be characterized via the phase-sensitive transient thermo-reflectance (PSTTR) technique, which uses a pump and a probe laser beams on the opposite sides of a sample and enables detection of the heat transfer through multiple layers and interfaces. In the PSTTR, the phase lag between a reference input from the pump laser modulation and the reflected probe laser is measured as a function of the modulation frequency, as shown in FIG. 5(A). By fitting the phase lag-frequency curve using a transient thermal model, the thermal properties of the samples can be extracted.

Only the measurement results for the copper nanowires with $\varphi=45\%$ are shown, because they have a higher thermal conductivity or a lower thermal resistance compared with the copper nanowires with $\varphi=20\%$. For three samples of copper nanowire arrays with $\varphi=45\%$, the effective thermal conductivities in the cross-plane direction are measured to be $83.8\pm34.4$ W/m·K., $91.6\pm37.6$ W/m·K, and $97.8\pm40.1$ W/m·K, respectively, which are consistent with the measured thermal conductivity of a single copper nanowire (~220 W/m·K.).

Figures 1A, 1B:
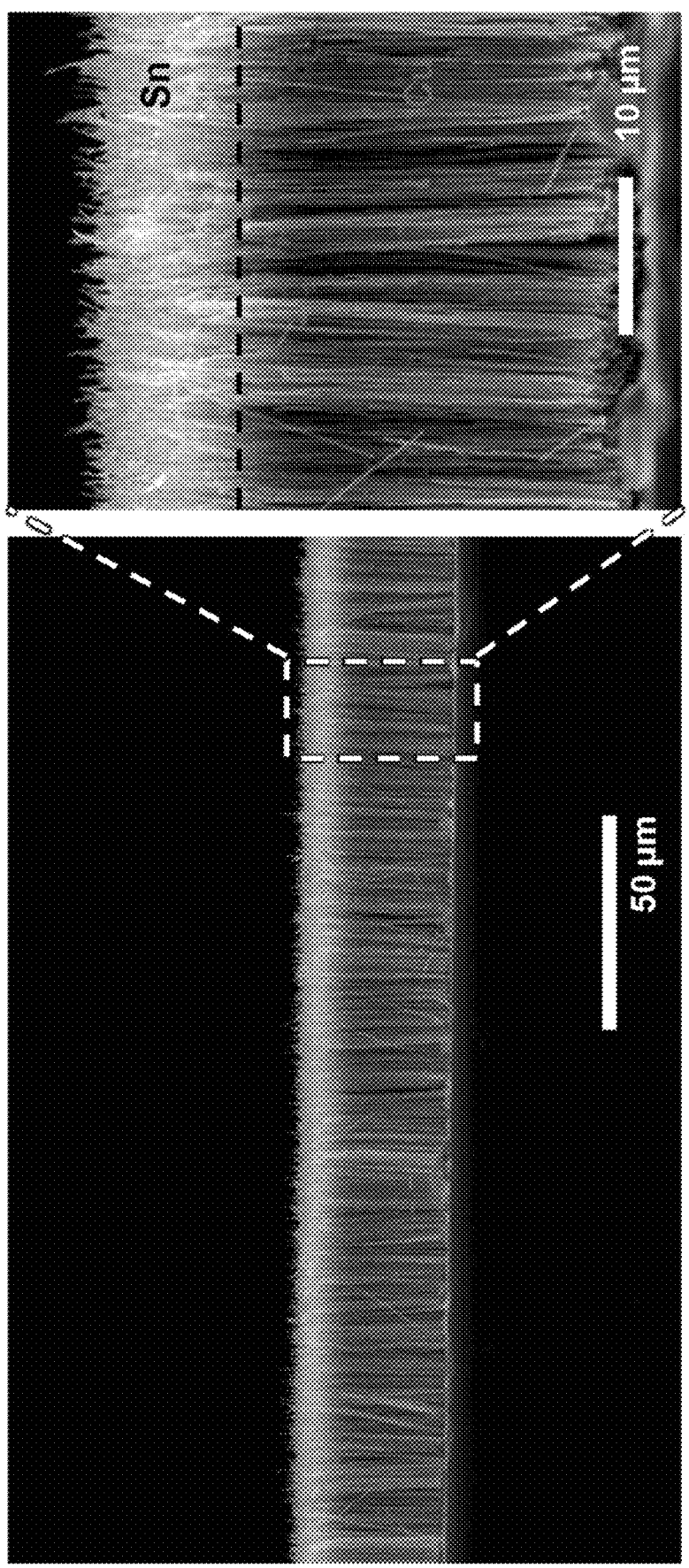
FIGS. 1(A)-1(B) are SEM images of a vertically aligned copper-tin nanowire array for use as a HPTIM clearly showing a darker portion of each nanowire composed of copper and a lighter portion composed of tin.

In a fully bonded configuration, where the HPTIM is employed to bond two silicon substrates, as shown in FIG. 1, their corresponding overall thermal resistances are $0.77\pm0.17$ mm$^2$·K./W, $0.51\pm0.09$ mm$^2$·K./W, and $0.57\pm0.10$ mm$^2$·K/W for complete HPTIM layer thicknesses (including nanowires and solder) of ~24 µm, ~14 µm, and ~27 µm, respectively. The thermal conductivity of copper nanowires (~100 W/m·K) is approximately one order of magnitude larger than common TIMs in literature, and the overall thermal resistance (~0.5 mm$^2$~K/W) of the HPTIM is 2 times better than that of the current state-of-the-art TIMs (~1 mm$^2$·K/W).

Figure 5B:
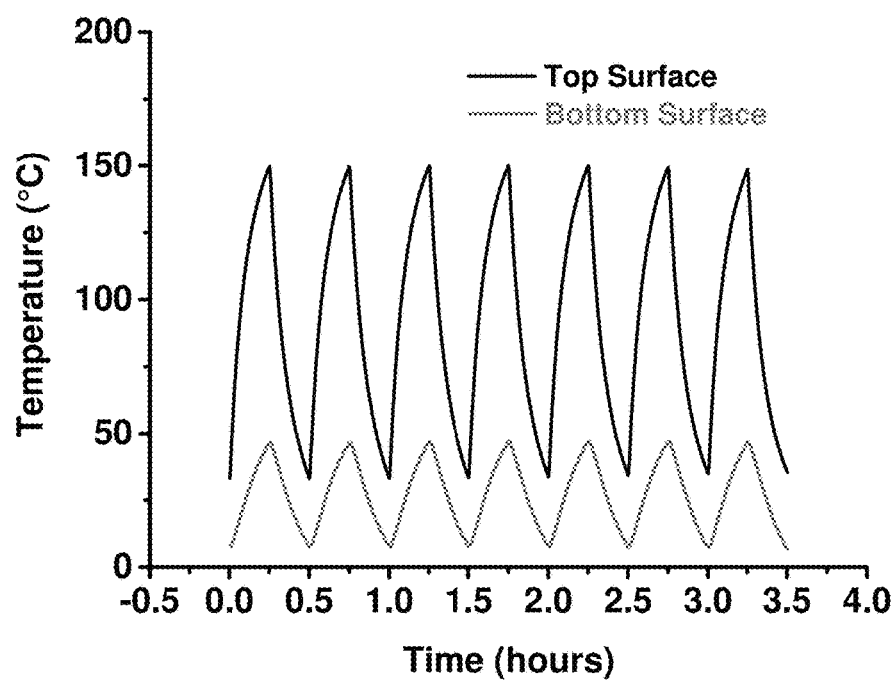
Figure 6A:
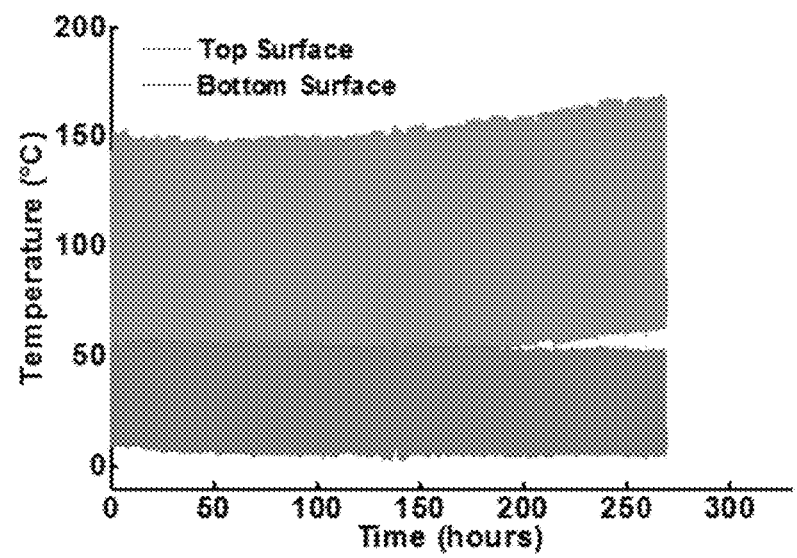
FIGS. 6(A)-6(B) are time/temperature graphs showing a comparison of the results of a thermal cycling test for a bonded assembly using pure tin and the HPTIM of the present invention, respectively.
Figure 6B:
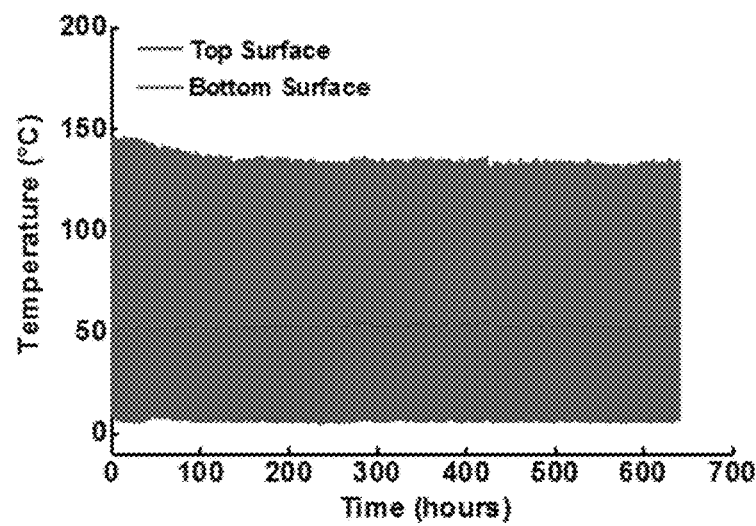

The most prominent feature of the HPTIM is its fatigue resistance under thermal cycles, which cause the cumulative fatigue or failure of conventional TIMs. Thermal cycle experiments that evenly included 15-minute heating/cooling periods per cycle were conducted. As shown in FIG. 5(B), two types of samples were tested in which two silicon substrates are bonded by ~20 µm thick HPTIM, in one example, and pure tin (regular solder) in another sample. During thermal cycle tests, constant heat fluxes were maintained across the samples, and thus the total thermal resistance is directly proportional to the temperature difference between the top and the bottom surfaces of the bonded assembly. For a typical HPTIM sample, where >1,280 cycles (or >640 hours) are conducted, as shown in FIG. 6(B), the top and the bottom surface temperatures of the assembly initially oscillate between 144° C. and 34° C., and between 51° C. and 7° C., respectively, in a heating/cooling cycle. Within the first ~200 cycles, the top surface temperature slightly decreases from 144° C. to 139° C., which may be attributed to the improved thermal contacts at local joints of copper nanowires and the tin layer due to the thermal annealing in the heating period.

In the remaining >1,080 cycles, the peak temperature difference between the top surface, shown as dark bands in FIG. 6(B) and the bottom surface, shown as blue bands in FIG. 6(B), are quite stable through the experiment. For a typical pure tin solder sample, where the top and the bottom surface temperatures of the assembly initially oscillate between 146° C. and 37° C., and between 40° C. and 7° C., respectively, the top surface temperature similarly decreases from 146° C. to 141° C. in the first ~200 cycles. However, in the remaining 1,100 cycles, the measured top surface temperature, shown as gray bands in FIG. 6(A), increases from 141° C. to 169° C., or the peak temperature difference between the top and the bottom assembly surfaces increases from 103° C. to 128° C., which clearly indicates the degradation of the solder. Experimental results demonstrate the high reliability of the HPTIM in a long term as compared to conventional solder TIMs.

Fabrication Process

Figure 7A:
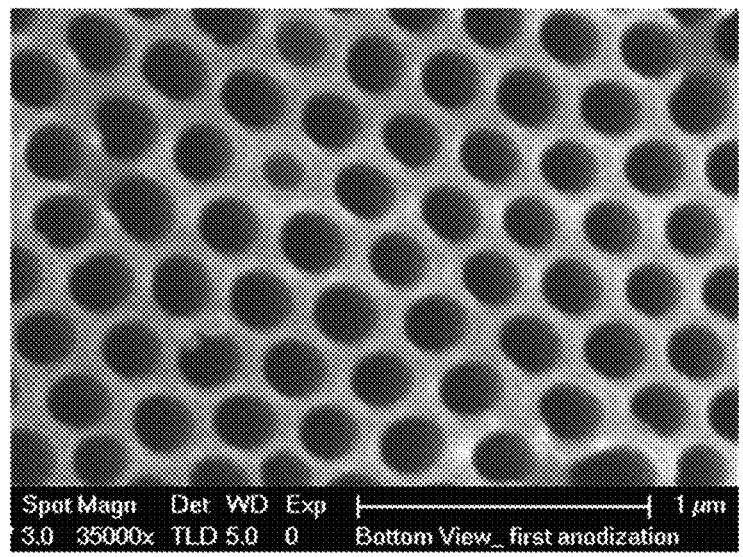
FIGS. 7(A)-7(B) are SEM images of large-scale nanoporous templates used to fabricate the vertically aligned nanowires.

In one embodiment, a thin layer of chromium (10 nm) and a thin layer of copper (100 nm) are sputtered sequentially on a silicon wafer as an adhesion layer and a seed layer, respectively. Alternatively, only a copper seed layer may be applied. A nanoporous anodic aluminum oxide (AAO) template, shown in FIG. 7(A), is then attached on the silicon wafer surface assisted by the capillary force of water. The PAA template is shown having an ordered arrangement of the nanopores.

The silicon wafer having the AAO template attached is put into a copper electroplating bath until the desired height of the copper segment of the nanowires is achieved. The wafer with the template is then put into a tin electroplating bath to apply the tin segment of the nanowires. Square wave-like current is applied in electroplating to reduce the stress. The lengths of the copper and tin segments are controlled by the electroplating time.

After electroplating, the nanowire embedded in the AAO template is patterned and diced to the desired shape and size. Finally, the AAO template is removed by etching in a potassium hydroxide (KOH) solution. In an alternate embodiment, a polycarbonate template, having a disordered arrangement of nanopores, may be used. Either arrangement of the nanopores (ordered or disordered) may be used, as long as the total area covered by the nanowires does not exceed the desired optimal density.

Bonding Process

The heterogeneous copper-tin nanowire arrays can be bonded with most metal surfaces. The bonding process is in general similar to soldering. Because tin has a melting point of 220° C., the sample must be heated above the melting point and then a compressive force exerted to press the nanowires and the substrate. After the tin is melted and cooled, it will hold the two pieces together. The purpose of the compression is to fix the substrates and provide a better contact (for compensating the surface roughness) during the bonding. The optimal compression force for a 1 cm*1 cm sample is 23-30 N. It corresponds to a pressure of 2.3e5-3.0e5 Pa, however, the force may vary depending on the size of the substrates.

The tips of copper nanowires, when bonding the substrates, can penetrate into the melted tin layer during soldering and be partially embedded in the tin layer after soldering. As a result, the copper nanowires suspended between the two substrates have a uniform length.

One advantage of the heterogeneous copper-tin nanowire array is that it can bond with relatively rough surfaces. In the bonding process, the tips of some heterogeneous nanowires will first contact the "bumps" on a rough surface while other nanowires remain non-contact. With the compression force applied in the bonding process, all the nanowires will finally contact with the rough surface, and the nanowires contacting with the bumps will slightly bend to accommodate to the shape of the rough surface. After the tin segments of the nanowires are melted, the liquid tin will flow freely to fill the gap and form a tight bonding. For surfaces with higher roughness, the heights of the nanowires (both copper and tin segments) can be tuned such that they accommodate the topography of the surface.

By combining compliant and thermally conductive copper nanowires with low melting point tin nanowires, the heterogeneous copper-tin nanowires are capable of dramatically increasing mechanical compliance while maintaining the high thermal conductivities of copper and tin. Experimental results demonstrate mechanical compliance of the vertically aligned copper nanowires in both the cross-plane and the in-plane directions which is comparable with polymers. The excellent thermal conductivity of the copper nanowires leads to an extremely small overall thermal resistance of the HPTIM in a fully bonded HPTIM assembly. The thermal cycling results unambiguously demonstrate the long-term reliability of the HPTIM. The HPTIM can benefit power electronics by allowing them to operate at lower temperatures, or at higher performance with higher power density.

One disadvantage of the described embodiment is that it is not freestanding. That is, it must be fabricated on the substrate on which it will be used. As such, it is incapable of being packaged as a product for delivery and use on other devices. Additionally, the copper nanowires are susceptible to oxidation. A second embodiment of the invention addresses these drawbacks. In this embodiment, the nanowires are grown on a metal seed layer and are coated with a 3D fuzzy layer of graphene. A second metal layer is then constructed on top of the nanowires. This forms a structure that is capable of being packaged and used elsewhere by surface bonding the structure to two substrates with a bonding agent.

Figure 7B:
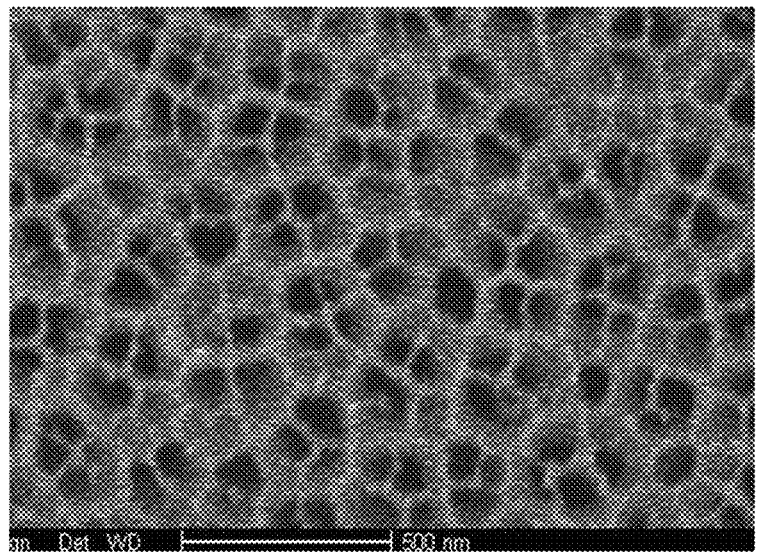
Figure 8A:
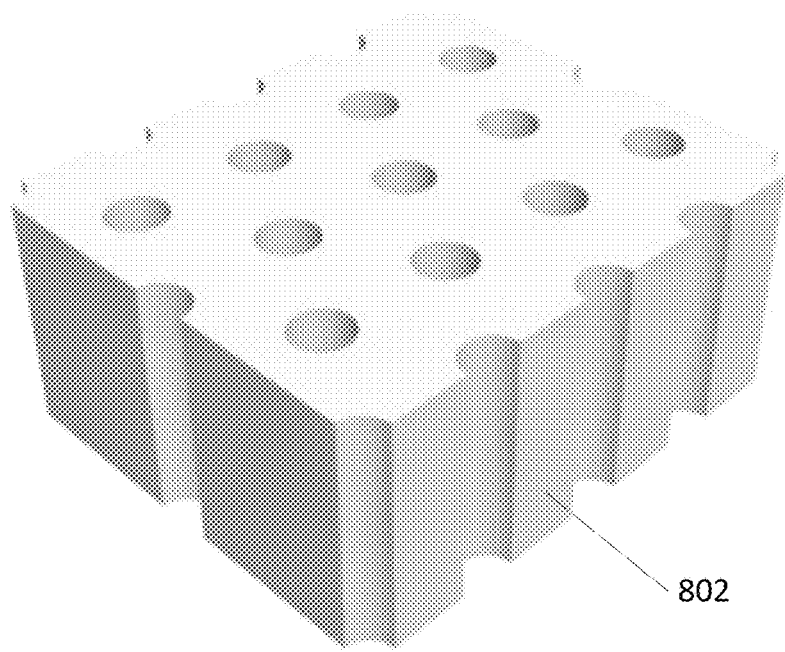
FIGS. 8(A)-8(F) are schematic representations of the steps used in the fabrication of a second embodiment of the invention in which the nanowires each have a 3D fuzzy graphene coating.

FIGS. 8(A)-8(F) are schematic representations of the steps of the fabrication process for the second embodiment. In FIG. 8(A), a nanoporous template 802 is fabricated via chemical synthesis. In preferred embodiments of the invention, an AAO template may be used. The AAO template is preferred as it allows for a denser growth of nanowires while also allowing the nanowires to be grown in a vertically-aligned fashion, that is, the nanowires are substantially vertically aligned along the entire height of the nanowires. The AAO templates shown in FIG. 7(A)-7(B) used in the first embodiment are also suitable for use in the second embodiment. As shown in the figure, the pores of the nanoporous template may be evenly distributed, as in FIG. 7(A), or randomly distributed, as in FIG. 7(B). In either case, it should be noted that the nanopores of the templates are not connected to each other, as may be the case with a polycarbonate (PC) template, which would produce a cross-linked network of nanowires instead of the well-separated, vertically-aligned nanowires of the present invention. In addition, the use of the AAO template allows for a denser filling ratio of nanowires between the top and bottom metal layers, typically between 30% in 70% in the preferred embodiment of the invention, as opposed to a PC template which is not capable of producing a filling ratio greater than 25%. In the preferred embodiment, because the graphene coating on the nanowire improves the thermal performance of the device, the filling ratio required may be lower than in the first embodiment of the invention but will still be within the 30% to 70% range.

Figure 9A:
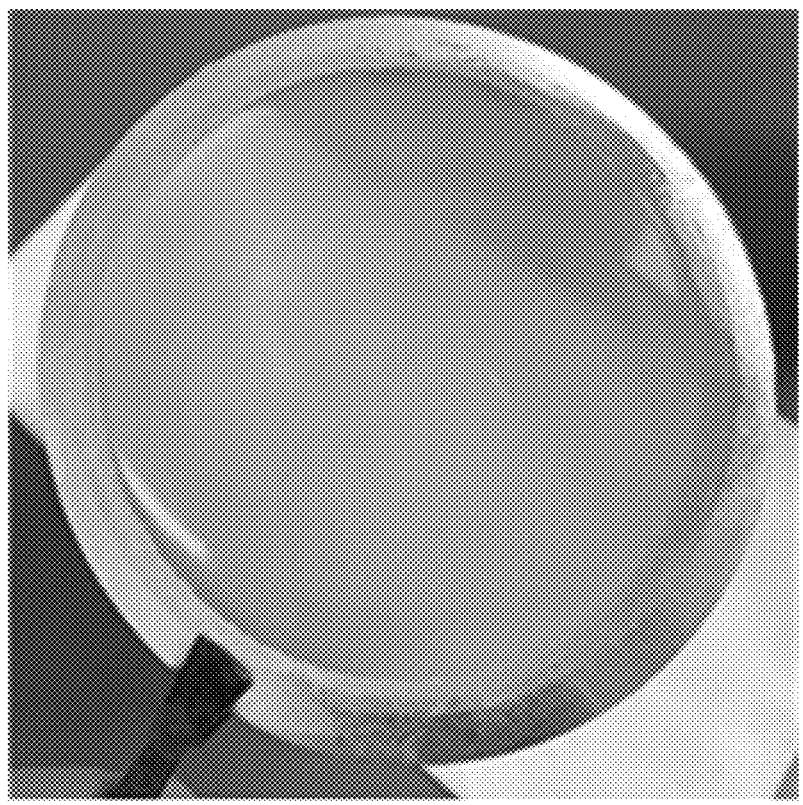
FIGS. 9(A)-9(B) are a photograph of the nanoporous template and a SEM image of the same template, respectively.
Figure 9B:
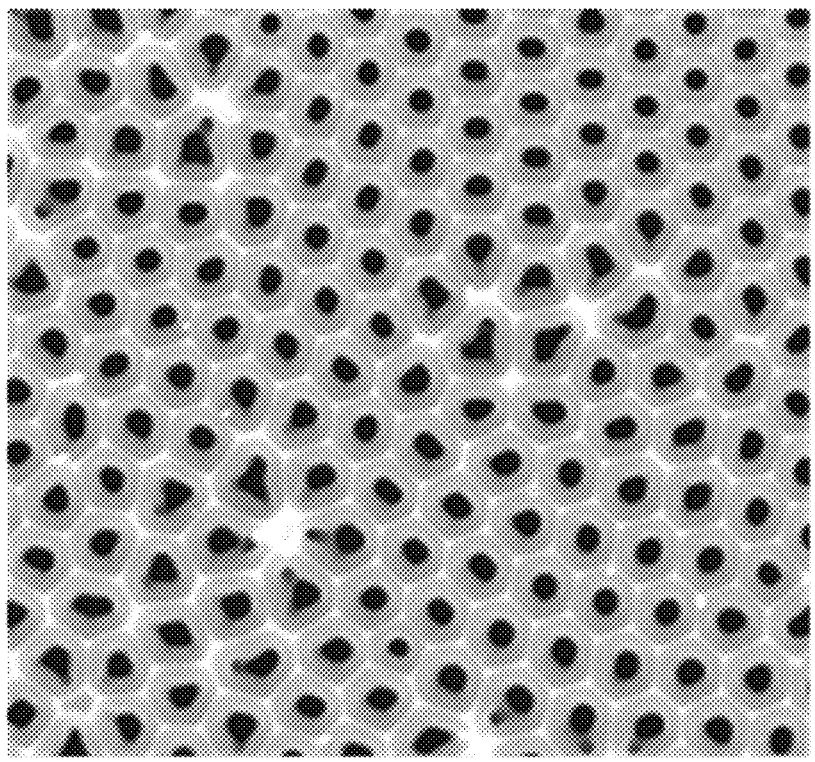

Nanoporous AAO template 802 may be formed by the electrochemical oxidation of aluminum in an acidic solution. High-purity polished aluminum foil (in one embodiment, 99.9999%, 0.25 mm in thickness, 3 inches in diameter) may serve as the anode, while an inert metal, for example, platinum may serve as the cathode. A 1 wt % phosphorous acid may be used as electrolyte. In one embodiment, with an applied voltage of 180V, it takes 64 hours to obtain 100 μm thick alumina film. The 1 mol/L $CuCl_2$ solution and 5 wt % phosphoric acid are used subsequently to obtain the through-hole AAO template. As one example, FIG. 9(A) shows a photographic image of the nanoporous template 802, while FIG. 9(B) is a SEM image of the top view of the nanoporous AAO template 802 with a pore size of 150 nm and an interpore distance of 450 nm, which corresponds to a ~30% porosity.

Figure 8B:
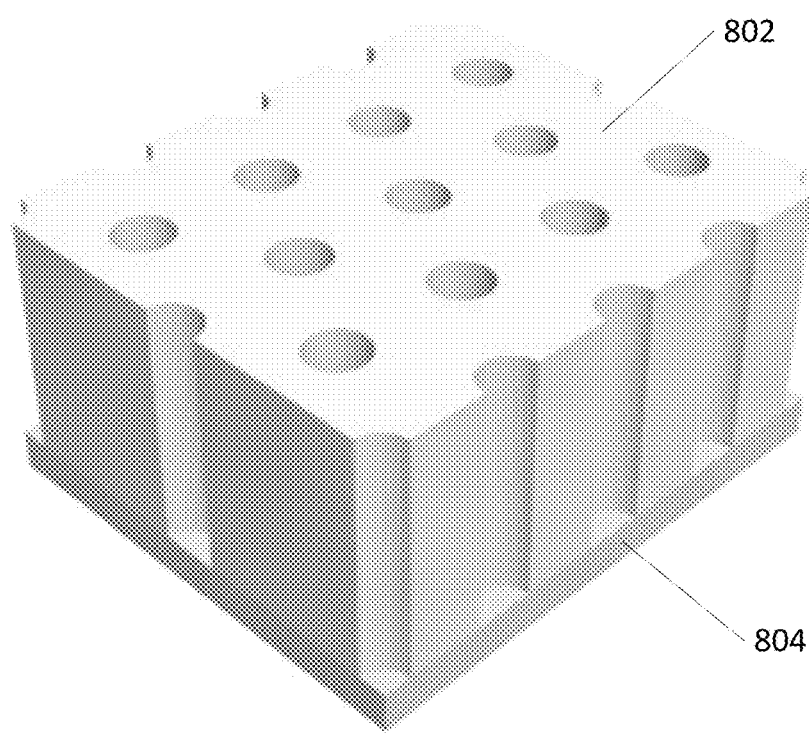
Figure 10:
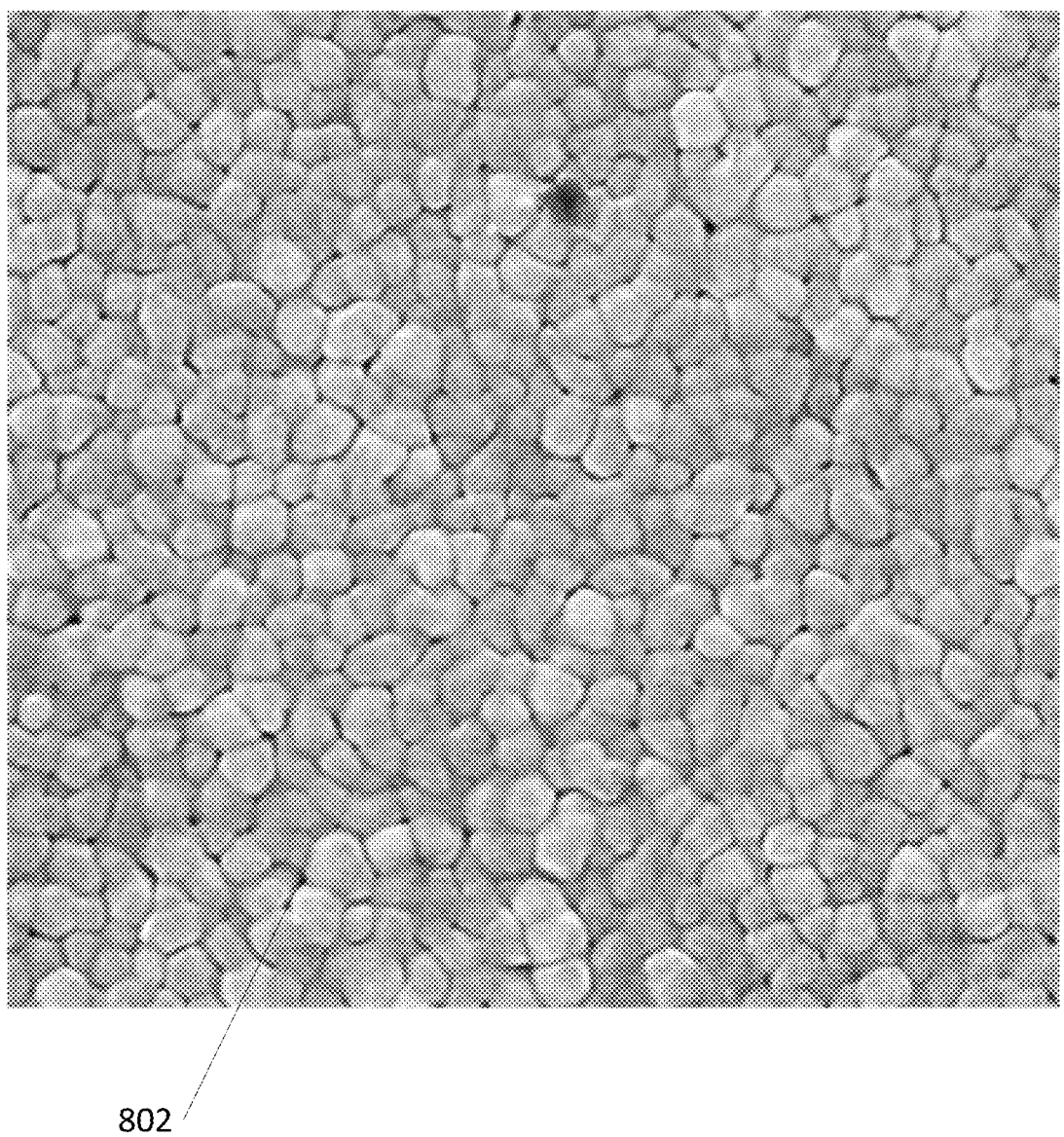
FIG. 10 is a SEM image of the surface of the seed layer.

FIG. 8(B) is a schematic representation of the second step in the fabrication process in which a seed layer 804 is applied to the nanoporous template 802. Seed layer 804 may be of any metal, for example, gold, platinum, tungsten, copper, etc. In preferred embodiments of the invention, because the nanowires are composed of copper, it is preferred that seed layer 804 also be composed of copper. In preferred embodiments, the seed layer 804 is applied by sputtering and have a thickness on the order of approximately 1 μm. A SEM image of the seed layer 804 shown in FIG. 10.

Figure 8C:
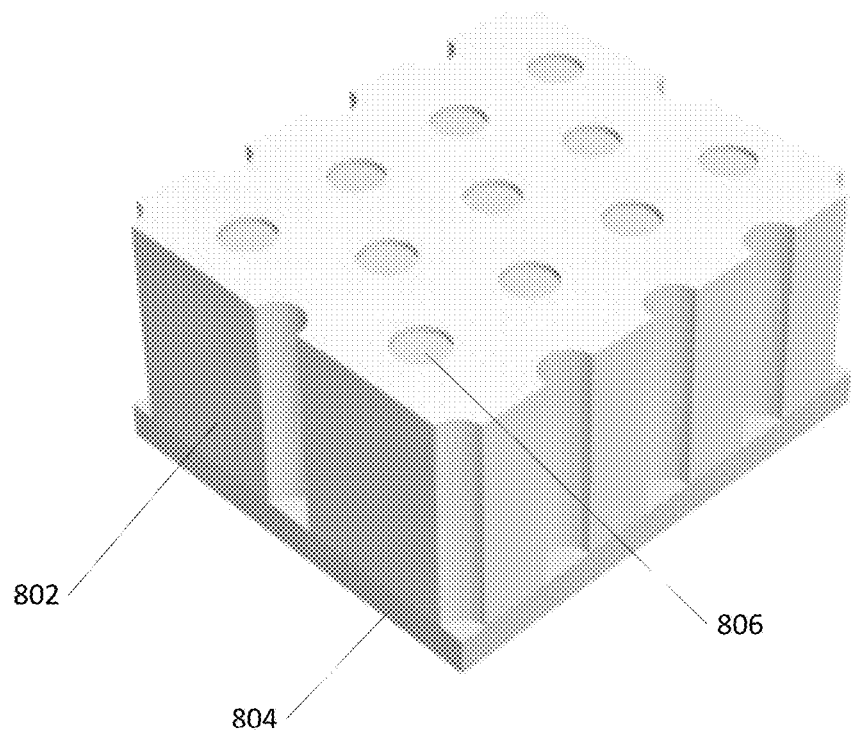
Figure 8D:
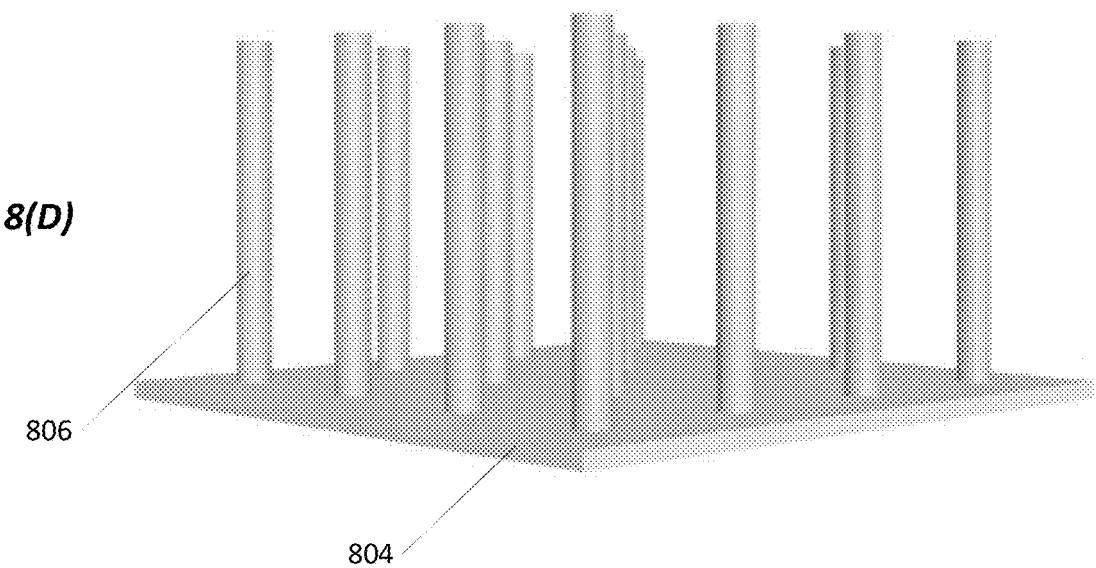

In the third step of the fabrication process, shown schematically in FIG. 8(C), the nanowire array is formed. In a preferred embodiment of the invention, the nanowires 806 are formed by an electroplating process, in which the AAO nanoporous template 802 is the cathode and a copper sheet is the anode. Preferably, the nanowires are composed of copper, but other metals may also be used. Preferably, the nanowires 806 are built no higher than the top of nanoporous template 802. Allowing the nanowires 806 to extend above the nanoporous template 802 will cause a layer of copper to form on the top of nanoporous template 802, making it impossible to etch away nanoporous template 802 in a timely manner.

In one embodiment, nanowires 806 may be fabricated as follows. Template 802 is fixed on a PTFE holder with metal contact by an O-ring. The holder is immersed in a copper electroplating bath. The anode may be a copper sheet with a size of 10 cm×10 cm×1 mm. An electrochemical workstation is used as the power source. The recurrent galvanic pulses mode is utilized while the current density is optimized as 0.0378 $A/cm^2$. The desired growth time and cycles for growing copper nanowires are determined by the electroplating area and the porosity of the nanoporous AAO template 802.

Figure 11A:
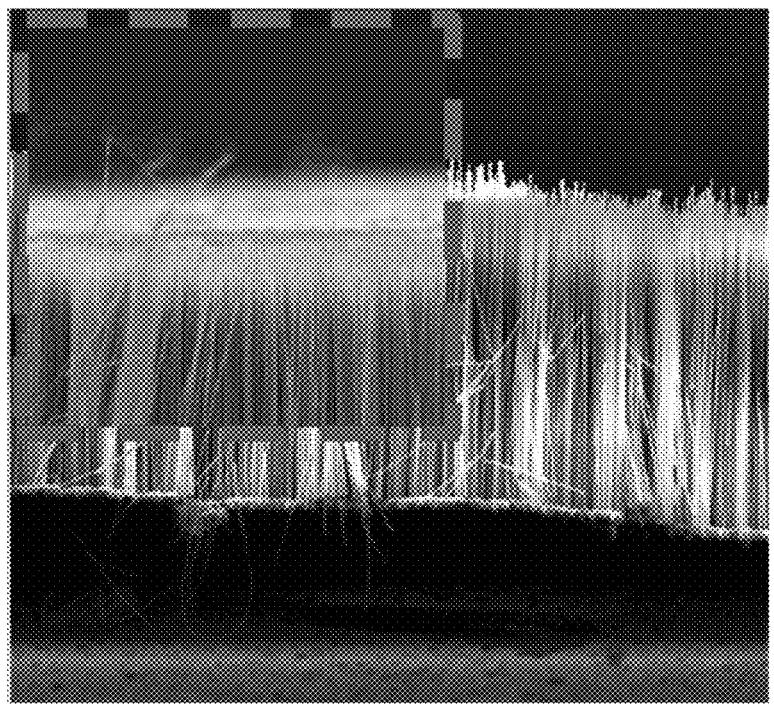
FIGS. 11(A)-11(B) are SEM images of the nanowires after release from the nanoporous template and a top view of the same nanowires, respectively.
Figure 11B:
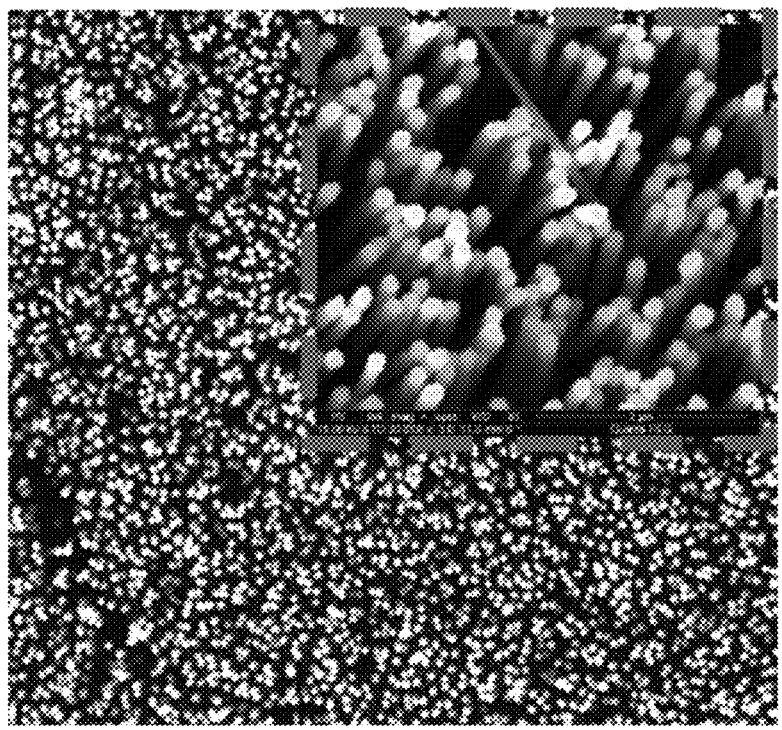

In the next step of the process, nanoporous template 802 is etched away, preferably by a KOH etching process. Nanowires 806 are thereby released. FIG. 11(A) shows the nanowires 806 after being released from nanoporous template 802. The etching of the nanoporous template 802 is followed by a supercritical drying process to avoid agglomeration of the nanowires 806. A SEM image showing a top view of nanowires 806 is shown in FIG. 11(B) and shows that the supercritical drying process avoids the agglomeration and provides well-separated nanowires 806.

Figure 8E:
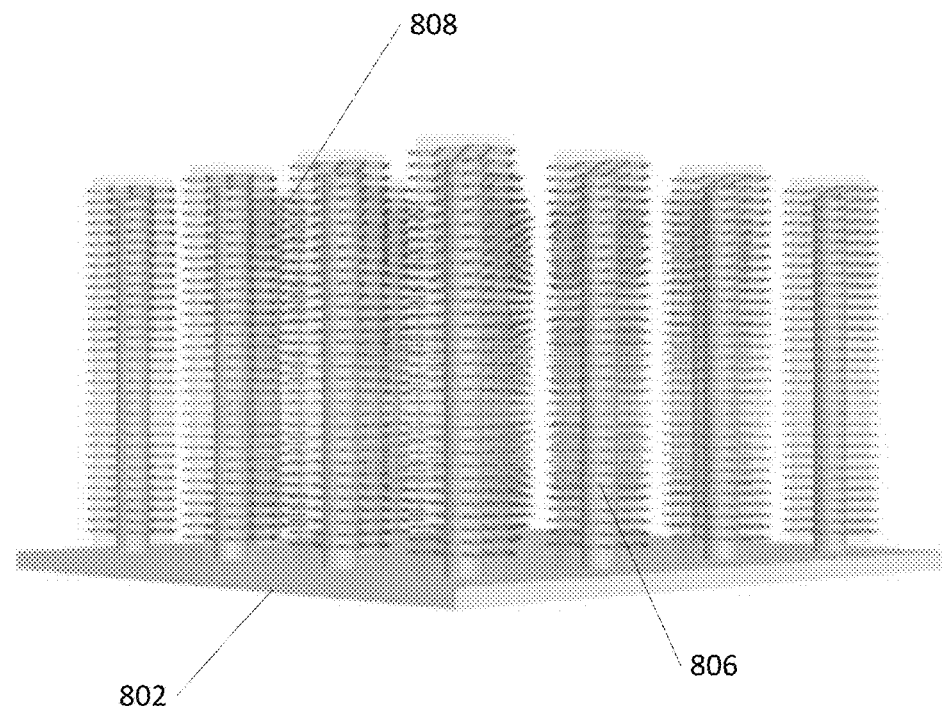
Figure 12A:
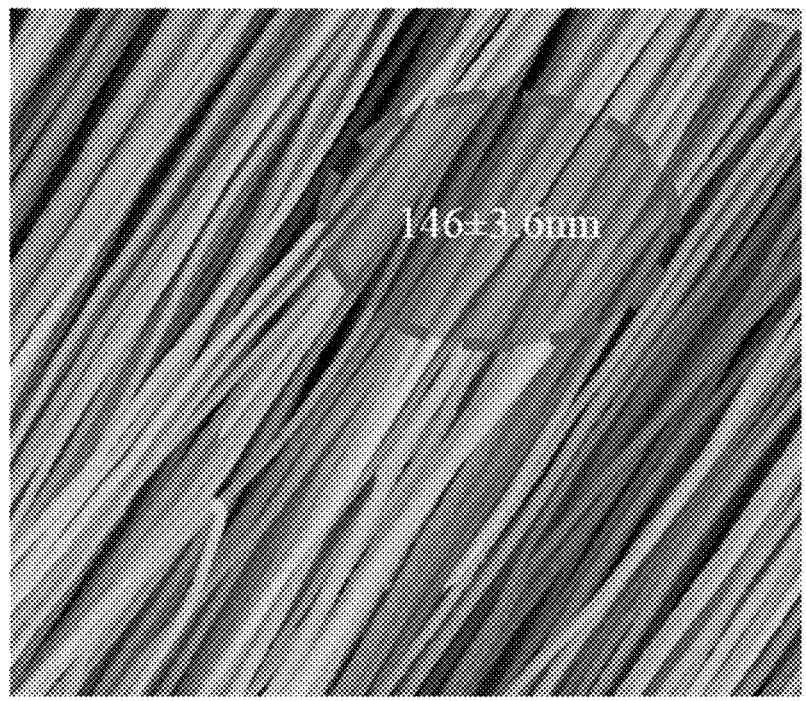
FIGS. 12(A)-12(B) are SEM images showing the nanowires prior to the application of the graphene coating and the nanowires after application of the graphene coating, respectively.
Figure 12B:
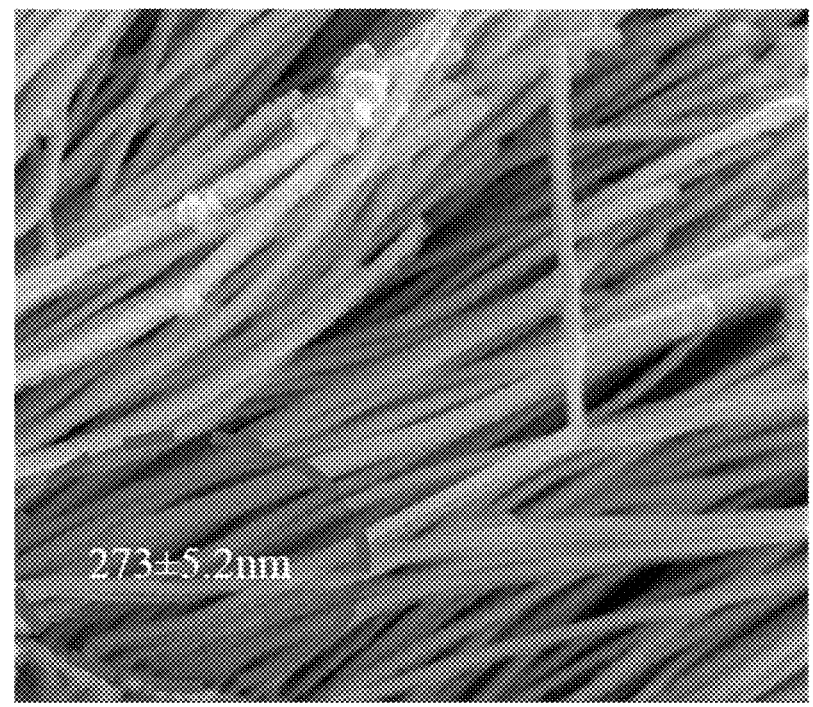
Figure 13:
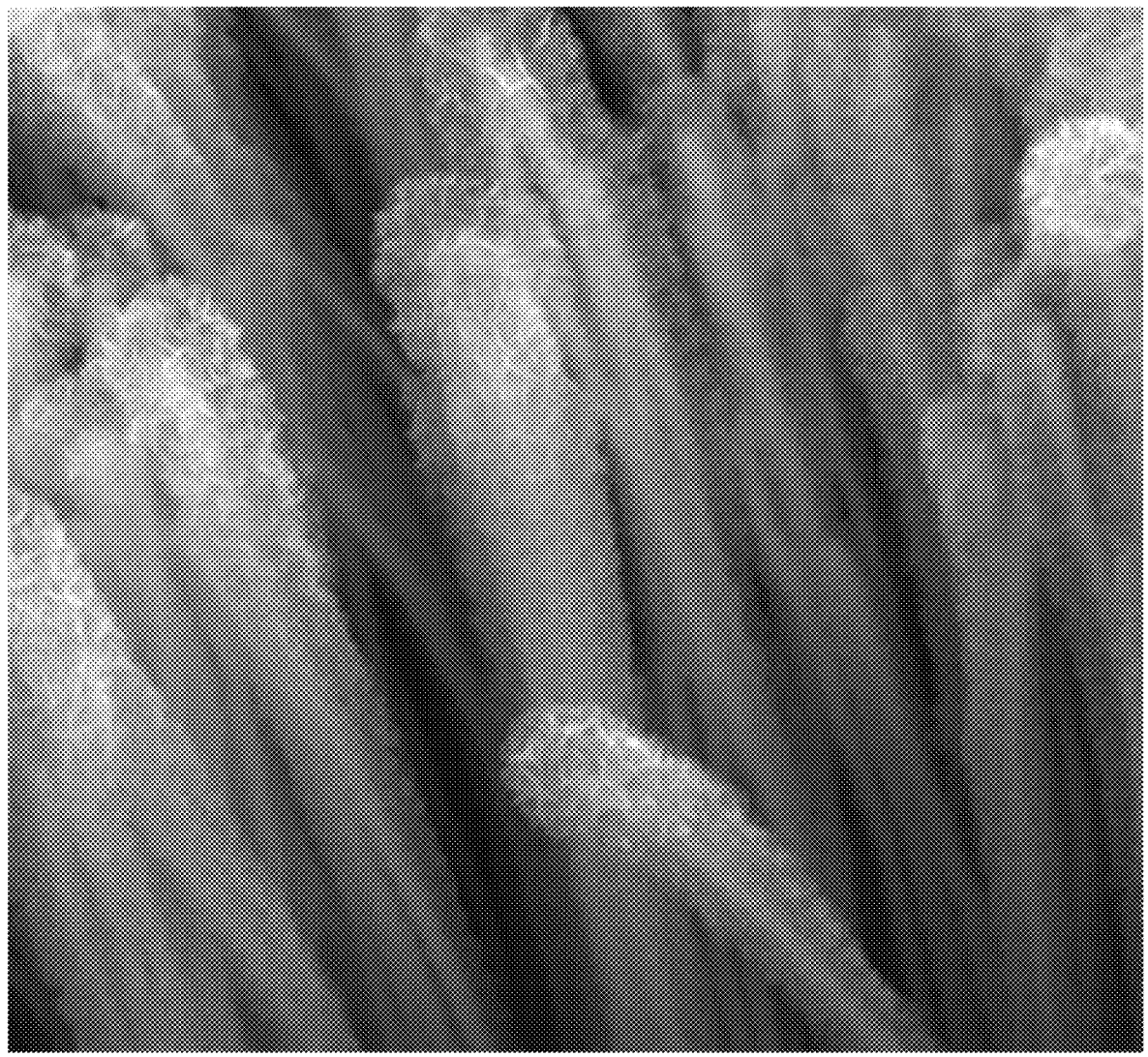
FIG. 13 is a SEM image of the nanowires showing the 3D fuzzy graphene coating.

FIG. 8(E) shows the next step of the process in which the nanowires 806 are coated with a 3D fuzzy graphene layer 808. Preferably, the graphene layer 808 will be deposited on nanowires 806 using a plasma enhanced chemical vapor deposition (PECVD) process. The plasma provides an ultra-high energetic ion bombardment to the exposed surface to form a fuzzy graphene layer 808 on each nanowire 806. The fuzzy graphene layer 808 enhances the thermal performance without compromising the mechanical compliance of the nanowires 806. FIG. 12(A) is a SEM image showing nanowires 806 prior to the deposition of the fuzzy graphene layer 808. The image shows the nanowires 806 having a diameter of approximately 143 nm, ±3.6 nm. FIG. 12(B) is a SEM image of the nanowires 806 subsequent to the deposition of the fuzzy graphene layer 808. The image shows that the nanowires 806 (with the fuzzy graphene coating) have increased in diameter to 273 nm±5.2 nm. FIG. 13 is a SEM image showing a closer view of the graphene coated nanowires 806 in which the 3D fuzzy graphene coating can clearly be seen.

The PECVD process temperature, time and nanowire length can all affect the quality of the graphene coating. If the process temperature is too high, copper nanowires 806 will become fused. When copper nanowires 806 are too long, the precursors cannot penetrate deeply into the nanowire array and form a uniform coating. It has been empirically discovered that the optimized process temperature and time are 700° C. and 2.5 hours. The optimized length of copper nanowires is ~30 μm to achieve a uniform graphene coating.

Note that the graphene layers shown in FIGS. 12(A)-12(B) and FIG. 13 are exemplary only, and that graphene layers of varying thicknesses can be used and are contemplated to be within the scope of the invention. Because the thermal conductivity of graphene can be as large as >1000 W/m-K, which is much higher than that of copper (~400 W/m-K), a thicker graphene layer may improve the thermal performance of the device. However, if the graphene layer is too thick, the mechanical compliance of the overall structure may be compromised. Moreover, the dense graphene coating also serves to protect copper nanowires 806 from oxidation in the ambient and at high temperatures.

Figure 8F:
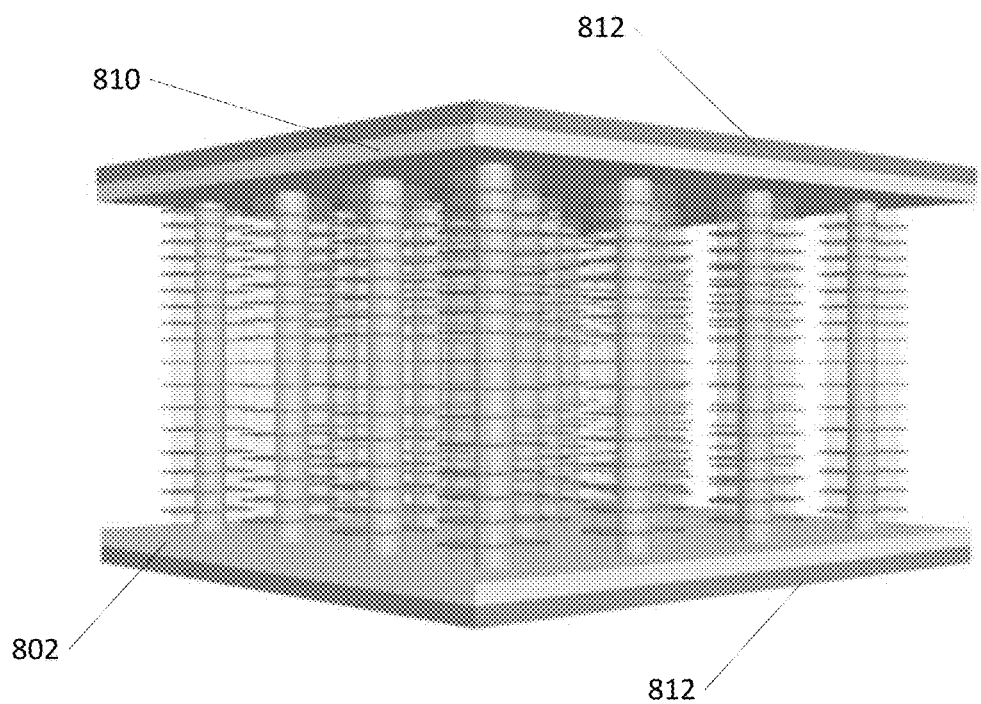
Figure 14A:
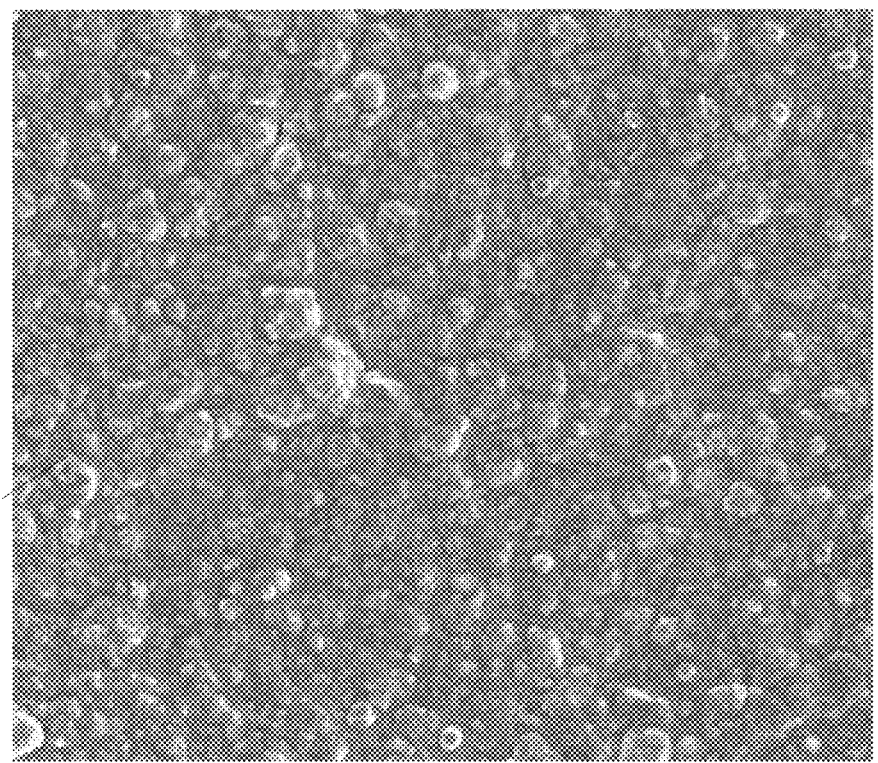
FIGS. 14(A)-14(B) are SEM images of a top view of the top metal layer of the thermal interface and a side view of the thermal interface showing the nanowire array bonded to the top metal layer, respectively.
Figure 14B:
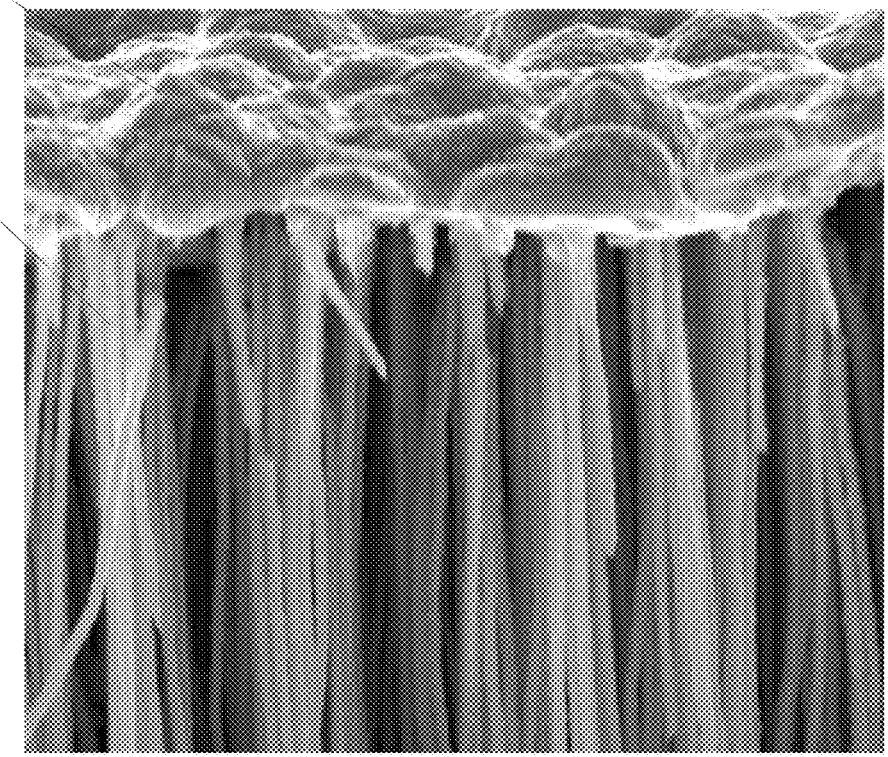

FIG. 8(F) schematically shows the final step of the fabrication process in which the top metal layer 810 is formed. Metal layer 810 serves to protect the graphene coated copper nanowires 806 from damage during the bonding process. It should be noted that the application of the fuzzy graphene layer 808 to the nanowires 806 renders the nanowire array hydrophobic, preventing the electroplating solution from penetrating into the nanowire array during formation of the top metal layer 810. Thus, during the electroplating, the electrolytes can only contact the tips of the nanowires 806 without penetration into the nanowire array, which ensures that the top metal layer 810 is only grown and bonded to the tips of the graphene-coated nanowires. As with lower metal layer 802 (i.e., the seed layer), upper metal layer 810 may be formed of any metal, for example, gold, platinum or tungsten, but in preferred embodiments is formed from copper. It should be noted that, prior to the application of the fuzzy graphene layer 808, the nanowire array is hydrophilic and attempting to form the top metal layer 810 by electroplating would cause the metal of the top layer 810 to extend down through the length of the nanowires 806, thereby destroying the nanowire array. The fact that the fuzzy graphing coating 808 makes the nanowire array hydrophobic allows the application of top metal layer 810 by electroplating. FIG. 14(A) is a SEM image showing a top view of upper metal layer 810 after being electroplated on the nanowire array. FIG. 14(B) is a SEM image showing a side view of the nanowire array having top metal layer 810 electroplated thereon.

The electroplating current and time also need to be optimized to obtain a top metal layer 810 that is low-roughness, continuous, and well bonded (with graphene coated nanowires 806) as shown in FIGS. 14(A)-14(B). In one embodiment, the optimized electroplating current density and time are ~0.018 A/cm$^2$ and ~12 minutes, respectively.

In another aspect of the second embodiment, shown in FIG. 8(F), a thin tin or solder layer 812 may be electroplated on the outside surfaces of the bottom seed layer 802 and top metal layer 810 to facilitate bonding of the interface between two substrates. In preferred embodiments of the invention, the solder layer 812 may be approximately 5 μm in thickness.

Figure 15:
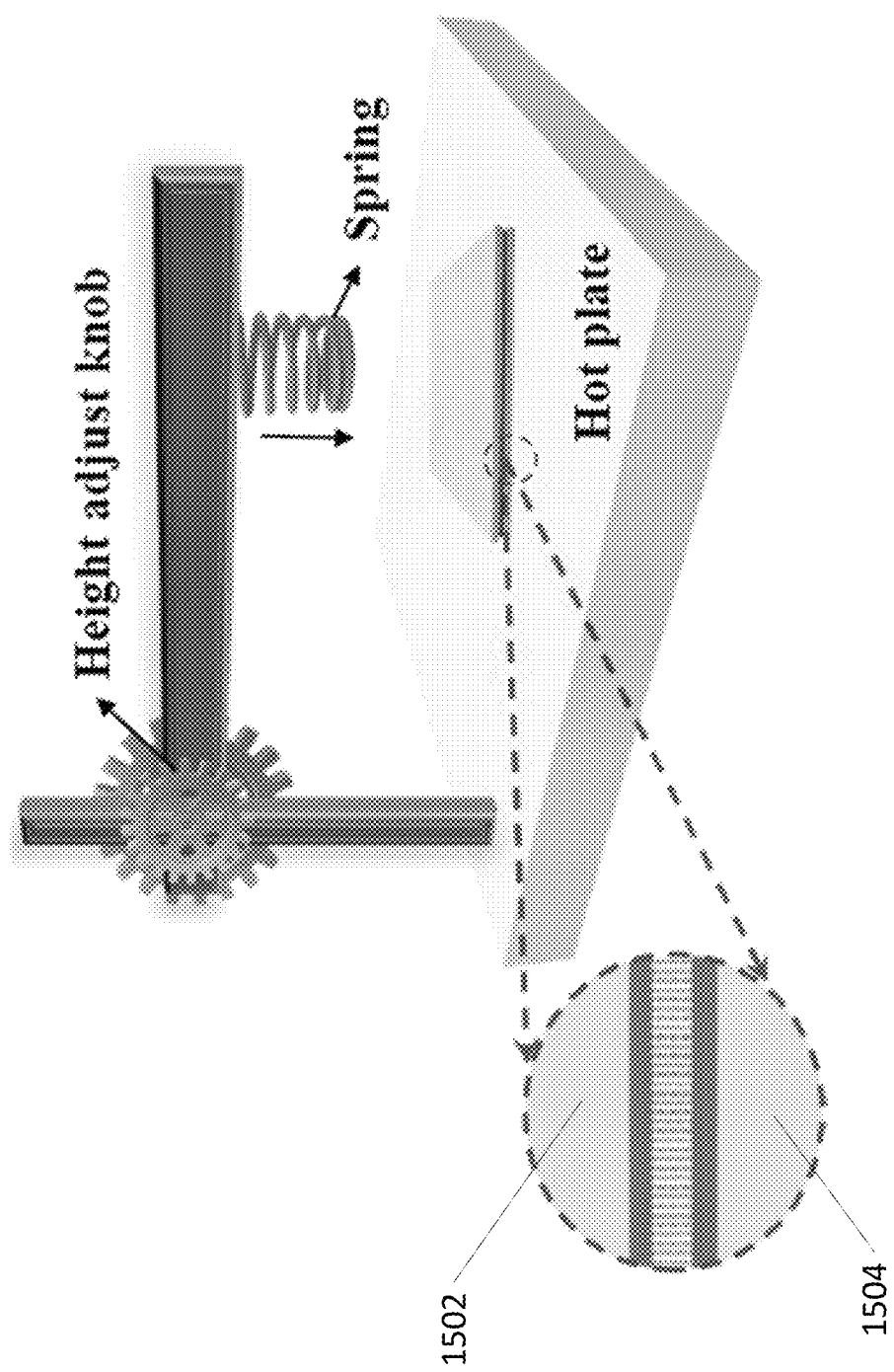
FIG. 15 is a schematic representation of a device which may be used to bond the thermal interface to substrates within an electronic device.

Using the described process, a fully free-standing, paper-like thermal interface is fabricated. The thermal interface may be employed, for example, to bond two silicon substrates using a bonding apparatus. FIG. 15 is a schematic representation of a bonding apparatus and the process of bonding the device between two substrates 1502 and 1504. To bond the device between the two substrates it is necessary to heat the structure up to the melting point of the solder (e.g. ~220° C.) for at least 15 seconds under appropriate pressure. The bonding process may be similar or identical to the bonding process described with respect to the first embodiment of the invention.

The second embodiment of the invention provides improvements over the first embodiment. Primarily, the device may be fabricated and packaged as a product to be used with other substrates, thereby eliminating the need to form the interface in situ. The 3D fuzzy graphene coating not only protects the nanowires from oxidation but also imparts a hydrophobic property to the nanowire array which allows the formation of the upper metal layer by electroplating. Absent the graphene coating, it is not possible to provide the upper metal layer by electroplating and, as such, it is not possible to productize the interface, as the interface would need to be formed directly on the substrate with which it will be used. Additionally, the graphene coating improves the thermal performance of the nanowire array without comprising its physical properties, which are similar to the nanowire array described with respect to the first embodiment of the invention.

We claim:

1. A thermal interface comprising:
   a nanowire array disposed between a first substrate and a second substrate;
   wherein the nanowire array is composed of a plurality of nanowires, each nanowire having a graphene coating.

2. The thermal interface of claim 1 wherein each nanowire has a height in a range between 10μm and 100 μm.

3. The thermal interface of claim 1 wherein each nanowire has a height of approximately 30 μm.

4. The thermal interface of claim 1 wherein the plurality of nanowires fill approximately 25% to 85% of the space between the first substrate and the second substrate.

5. The thermal interface of claim 1 wherein the graphene coating on each nanowire extends approximately 30 μm from the surface of the nanowire.

6. The thermal interface of claim 1 wherein the nanowires are composed of segmented portions of copper and tin.

7. The thermal interface of claim 6 wherein the copper portion of each nanowire comprises between 60% to 80% of the overall height of the nanowire.

8. The thermal interface of claim 7 wherein the tin portion of each nanowire comprises between 20% to 40% of the overall height of the nanowire.

9. The thermal interface of claim 1 wherein an aspect ratio of each nanowire is in the range of 100-1000.

10. The thermal interface of claim 1 wherein the elastic modulus of each nanowire is in the range of 200 MPa to 1.5 GPa.

11. The thermal interface of claim 1 wherein the shear modulus of each nanowire in the range of 2 MPa to 15 mPa.

12. The thermal interface of claim 1 wherein the first and second substrates are composed of material selected from a group comprising a metal, a dielectric material and a semiconductor material.

13. The thermal interface of a claim 12 wherein the first and second substrates are composed of metal.

14. The thermal interface of claim 13 wherein the first and second substrates are composed of copper.

15. The thermal interface of claim 13 wherein the nanowires are composed of copper.

16. The thermal interface of claim 13, further comprising:
   a first layer of solder disposed on an outer surface of the first metal layer opposite the nanowires; and
   a second layer of solder disposed on an outer surface of the second metal layer opposite the nanowires.

17. The thermal interface of claim 16 wherein the first metal layer and the second metal layer are approximately 1 µm in thickness.

\* \* \* \* \*